United States Patent [19]

Hansen

[11] Patent Number: 4,660,145
[45] Date of Patent: Apr. 21, 1987

[54] SYSTEM FOR COMPRESSING AIRCRAFT FLIGHT DATA UTILIZING A MULTILEVEL TIME FORMAT

[75] Inventor: Steven D. Hansen, Seattle, Wash.

[73] Assignee: Sundstrad Data Control, Inc., Redmond, Wash.

[21] Appl. No.: 576,537

[22] Filed: Feb. 3, 1984

[51] Int. Cl.[4] ............................................. G06F 15/20
[52] U.S. Cl. ................................................... 364/424
[58] Field of Search ................ 364/424, 200 MS File, 364/900 MS File; 360/5; 369/21

[56] References Cited

U.S. PATENT DOCUMENTS

| | | | |
|---|---|---|---|
| 3,185,823 | 5/1965 | Ellersick, Jr. et al. | 364/900 |
| 3,344,406 | 9/1967 | Vinal | 364/900 |
| 3,501,750 | 3/1970 | Webb | 364/900 |
| 4,409,670 | 10/1983 | Herndon et al. | 364/900 |
| 4,470,116 | 9/1984 | Ratchford | 364/424 |

Primary Examiner—Thomas M. Heckler
Attorney, Agent, or Firm—Christensen, O'Connor, Johnson & Kindness

[57] ABSTRACT

A data processing system for use in a solid state flight data recorder wherein a plurality of aircraft parameter signals are processed and stored in electronic memory for later retrieval. The processor identifies those aircraft parameter data signals to be stored and for each such datum signal produces a signal triplet comprised of a parameter label signal, a time tag signal representative of the time interval from a reference time within which the data signal was produced, and the datum signal. A frame of the data bit stream produced by the data processor for storage in the memory includes an initial reference time signal followed at fixed intervals by time tick signals. Each signal triplet is positioned in the data bit stream following that initial reference time signal or time tick signal to which its time tag signal is referenced. By so tiering the data time formatting a substantial compression of data is realized thereby reducing memory size requirements.

36 Claims, 7 Drawing Figures

PRIOR ART

SYSTEM FOR COMPRESSING AIRCRAFT FLIGHT DATA UTILIZING A MULTILEVEL TIME FORMAT

TECHNICAL FIELD

This invention relates to the field of aircraft flight data recorder data compression systems and, in particular, to a system for flight data compression utilizing a multilevel time format.

BACKGROUND OF THE INVENTION

A particular application for a data processing system is found in a flight data recorder. Flight data recorders are monitoring and recording instruments, carried aboard an aircraft, which systematically monitor and store the instantaneous values of various aircraft parameters. Early recorders were analog electromechanical devices which periodically marked, in analog form, the value of a given airplane parameter on a moving wire or other permanent storage medium. The time of occurrence of the parameter was also suitably scribed into the medium opposite the sensed parameter mark.

Subsequently, digital flight data recorders have been developed which operate by converting each analog aircraft parameter into a corresponding digital signal, and storing the digital signals on a permanent storage medium such as magnetic tape.

The numerous mechanical parts employed in the analog and digital type electromechanical flight data recorders have rendered such units expensive to construct and bulky in design, requiring periodic maintenance of the mechanical parts.

The development of solid state memory devices, such as electrically erasable programmable read-only memory ($E^2PROM$) or electrically alterable read-only memory (EAROM), has led to the design of all solid state flight data recorders. Solid state flight data recorders commonly employ a data acquisition system (DAS) which receives and processes the various aircraft input signals to be monitored and stored under the control of a central processing unit (CPU). Programming within the CPU controls the processing of input parametric signals to corresponding digital signals through the DAS and the subsequent transference of these ditital signals to controlled locations in the solid state memory.

A feature of the aforedescribed electromechanical flight data recorders is that additional data may be stored by these units simply by increasing the amount of storage medium as, for example, increasing the length of magnetic tape used to store signals. With solid state flight data recorders, however, the memory size is typically fixed by the number of solid state memory devices employed. In order to maximize the use of available solid state memory, therefore, it is desirable to provide data processing techniques which employ data compression to thereby reduce the amount of digital data required to be stored. Inasmuch as the storage and retrieval of data from a flight data recorder must be accomplished reliably, the data compression processing employed must be capable of reliable decompression to assure data integrity.

SUMMARY OF THE INVENTION

The present invention, therefore, is directed to a data processing system for use in a flight data recorder, which system is capable of reliably compressing signals to be loaded into a memory device.

Briefly, according to the invention, apparatus for processing and selectively storing in an aircraft flight data recorder a plurality of input data signals, wherein each input datum signal represents the status of a parameter of an aircraft at a point in time, comprises memory, for predeterminedly storing signals loaded therein, and a data processor. The data processor includes means for:

(a) periodically producing a reference time signal representative of elapsed time from a predetermined initial time period,
(b) sequentially determining, in accordance with a predetermined program, whether each datum signal is to be stored and, in response to each datum signal to be stored:
  (i) producing a label signal representative of the parameter corresponding to said datum signal,
  (ii) producing a time tag signal representative of the time interval from the reference time within which the datum signal was produced, and
  (iii) producing the datum signal; and
(c) predeterminedly loading each data processor produced signal into the memory.

Preferably, the data processor further produces a time tick signal which is indicative of a predetermined elapsed time from the preceding produced reference time signal. Each time tag signal produced subsequent to a time tick signal is indicative of a time interval from the preceding time tick signal within which the corresponding datum signal was produced.

Also, for applications wherein the input data represents the status of predetermined parameters of an aircraft processed at successive time periods the data processor preferably includes means for recalling the last datum value stored for a selected parameter. The present datum value is compared with the recalled data value and the present data value is stored in the memory in response to the difference between the datum value and the recalled datum value exceeding a predetermined tolerance range for the particular parameter.

In addition, the data processor is operable in a special event mode to identify predetermined data signals stored in the memory both prior, and subsequent to a special event condition and prevent these signals from being overwritten. In a snapshot mode, the data processor stores a datum signal at a predetermined point in time for each system parameter.

DETAILED DESCRIPTION

Figure 1:
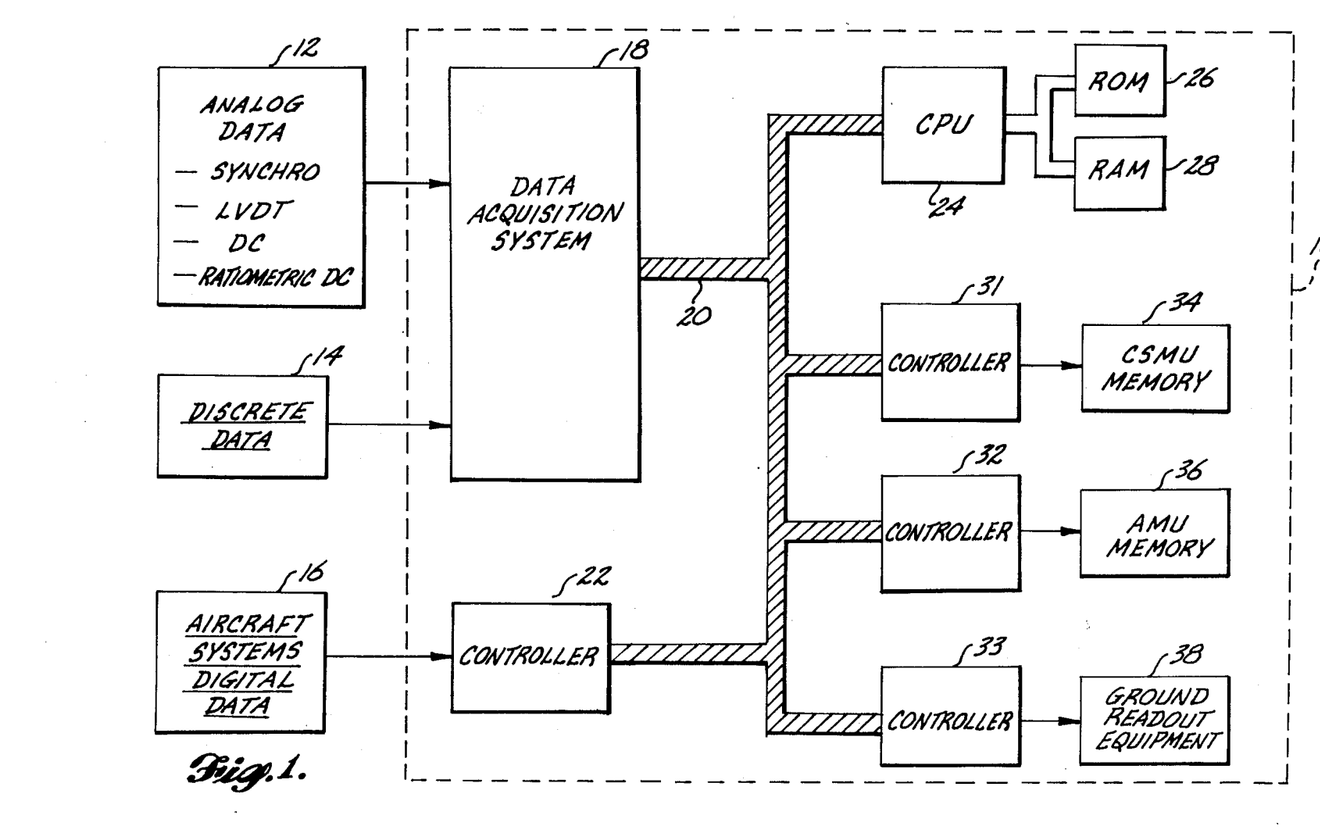
FIG. 1 is a block diagram illustrating the principal components of a solid state flight data recording system.

FIG. 1 is a block diagram illustrating the principal components of a solid state flight data recording system, shown enclosed within dotted line 10. A flight data recorder is carried aboard an aircraft and systematically monitors and stores information related to aircraft parametric data. Such recorded data may be analyzed at a subsequent time to yield information related to the source of an aircraft mishap, or simply to provide a diagnostic and information tool as to the aircraft's performance. Variously configured flight data recording systems are known to those skilled in the art, with the system depicted in FIG. 1 corresponding to the system disclosed in the U.S. patent application of Edward A. Stephenson, entitled "Aircraft Flight Data Recorder Data Acquisition System," Ser. No. 576,538, filed Feb. 3, 1984, and assigned to the same assignee as this patent application.

The flight data recorder must be capable of receiving and processing three distinct types of parametric data. The first data grouping is analog data, indicated by block 12. The analog data may be any one of four distinct types. Information related to an angle, such as engine nozzle position, is commonly provided by a synchro sensor. Each synchro sensor typically provides three active signals $S_1$, $S_2$, and $S_3$ which are phase and amplitude related to a reference signal (commonly 400 Hz in aircraft). By processing the three active signals in the known manner, the angle of the parameter being monitored is derived.

A second type of analog data is AC ratiometric data. AC ratiometric data is typically provided in aircraft by a sensor known as a linear variable differential transformer (LVDT). An LVDT is commonly employed to monitor an aircraft control surface position. It produces AC output signals, the ratio of which is related to relative movement between component parts of the LVDT and, thus, deflection of the control surface being monitored.

Finally, analog data signals may be either DC or ratiometric DC signals. The standard DC signals are voltage levels which vary within a defined range, the magnitude of which is indicative of the status of the parameter being monitored. Ratiometric DC signals are signal pairs, the ratio of which is indicative of the parameter being monitored. An example of a ratiometric DC signal is the output from a potentiometer. Typically, a voltage is applied across the resistive element of the potentiometer, this voltage constituting the first ratiometric signal. The wiper of the potentiometer is linked to the parameter being monitored such that it moves in response to parameter changes. As such, the ratio of the wiper voltage to the total resistive element voltage is indicative of the value of the parameter being sensed. An example of ratiometric DC signal produced in an aircraft is a throttle position sensor signal.

Discrete data, indicated by block 14, are signals which assume either a low or a high state in response to the status of the parameter being monitored. Such signals are commonly produced by switches, an example in aircraft being the squat switch which produces a discrete output indicating whether or not the aircraft landing gear is under load.

Finally, the flight data recorder receives digital data, as indicated at block 16. The digital data originates from other systems within the aircraft. For example, digital information indicative of navigation information, as produced by aircraft on-board navigation computers, is provided on a data bus to which the flight data recorder is tied.

Both the analog data 12, and the discrete data 14 are processed within the flight data recorder through a data acquisition system 18. The function of the data acquisition system 18 is to receive each analog and discrete input signal and, under external control, sequentially convert each input signal to a corresponding ditigal signal. The digital signals are then output on a system bus 20.

The controller 22 receives the input digital data from the aircraft systems 16. The controller 22 provides any required signal conditioning and is responsive to external control to output the digital data on system bus 20.

Overall control for the flight data recorder is provided by a central processing unit (CPU) 24. Associated with the CPU 24 is a read-only memory (ROM) 26 which contains the programming used by the CPU 24. Also associated with CPU 24 is random access memory (RAM) 28 which is used by CPU 24 as required for temporary storage, such as a "scratch pad" for use in performing calculations.

Also attached to the system bus 20 are three controllers 31–33. The first controller 31 connects to the crash survivable memory unit 34. The crash survivable memory unit 34 is a solid state memory storage which is housed within a container designed to survive an aircraft crash.

Connected to the output of controller 32 is an auxiliary memory unit 36. As with the crash survivable memory unit 34, the auxiliary memory unit 36 includes solid state, electronic memory. Electrically erasable programmable read-only memory ($E^2PROM$) may be used as the storage devices in either the crash survivable memory unit 34 or the auxiliary memory unit 36.

The output from controller 33 is adapted for connection to ground read out equipment 38. Once the aircraft has landed, information stored within the crash survivable memory unit 34 or the auxiliary memory unit 36 may be accessed by the ground read out equipment 38 and stored on magnetic tape or other permanent storage medium.

Operation of the flight data recorder, as shown in FIG. 1, is understood as follows. The CPU 24, in response to its programming stored in ROM 26, sends commands to the data acquisition system 18 instructing that certain analog data 12 or discrete data 14 be converted to corresponding digital signals. Once the analog or discrete data signals have been processed by the data acquisition system 18, an interrupt signal is sent from the data acquisition system to the CPU 24 over the system bus 20.

Similarly, the CPU 24 may access any digital data from the aircraft systems 16 via commands to the controller 22.

In response to the digital parametric signals from the data acquisition system 18 and the aircraft systems 16 through controller 22, the CPU performs any further signal processing required (such as converting synchro or LVDT signals to corresponding angle or position signals, respectively), thereafter loading the digital signals into either the crash survivable memory unit 34 or the auxiliary memory unit 36 via commands to the appropriate controllers 31, 32, respectively. Typically, parametric data related to system failures on the aircraft is loaded into the crash survivable memory unit 34, whereas data which is informational in nature is routed to the auxiliary memory unit 36.

Upon landing, the ground read out equipment 38 is attached to the system via controller 33 and, by appropriate commands to the CPU 24, data stored within the crash survivable memory unit 34 and the auxiliary memory unit 36 may be read out and loaded into permanent storage.

As mentioned hereinabove, conventional electromechanical flight data recorders use a storage medium such as magnetic tape to record the parametric data. In such systems, memory capacity is easily increased simply by providing extra magnetic tape.

Figure 2:
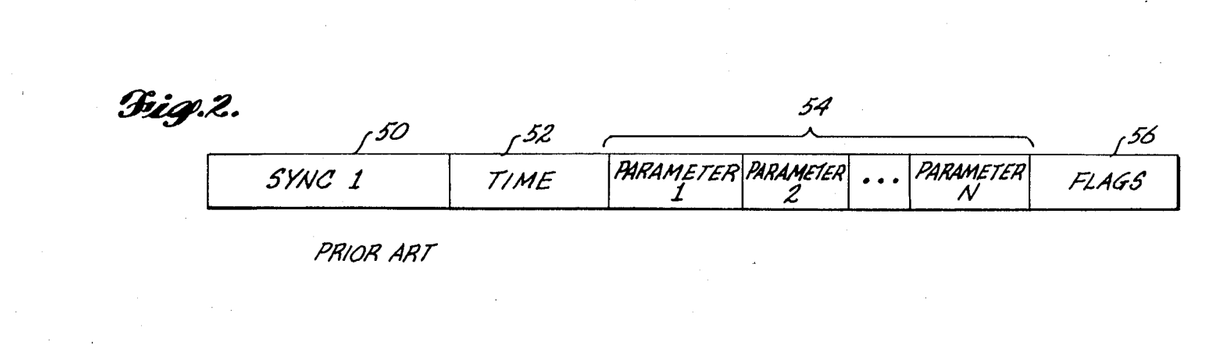
FIG. 2 illustrates the format of a data bit stream known to prior art flight data recorders.

FIG. 2 illustrates the data format commonly found in electromechanical type digital flight data recorders. A frame of data begins with a synchronization (SYNC) signal 50. The SYNC signal is a unique multibit signal indicating the beginning of a frame, and is used in extracting data to identify each frame segment. Following the SYNC signal 50 is a multibit time signal 52. The time signal 52 indicates elapsed time from some reference time, such as take-off, in which the data signals in the frame were recorded. Following the time signal 52 is a sequence of parameter data signals, one for each parameter being monitored. Since each parameter is recorded during each frame, no label tag need be associated with each parameter. Rather, each parameter data signal is output in sequence, this sequence being known by the recording equipment during playback of the magnetic tape. After the last parametric data signal (parameter N) is recorded, one or more flag signals 56 are recorded which are used to indicate data integrity. An example might be a checksum signal which is a digital signal indicating the sum of the values of the parameters 1-N. Upon reading the data from memory, the read out equipment computes its own data sum, and compares this with the checksum signal to provide assurance that the integrity of the data has been preserved.

While the data format of FIG. 2 is acceptable for electromechanical systems having high storage capacity via magnetic tape, this format has proved unsuitable for use in solid state flight data recorders, such as is shown in FIG. 1. Solid state data recorders have relatively limited memory size due to the capacity of the solid state memory devices employed. As a result, in order to record sufficient information in the electronic memory, the data must be compressed prior to being stored.

Figure 3:
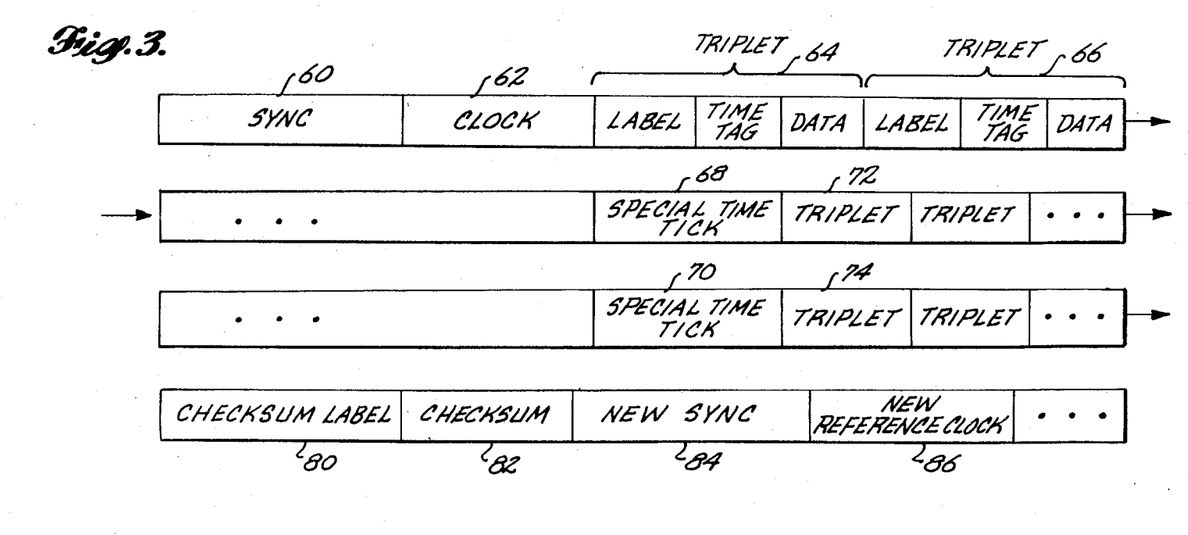
FIG. 3 illustrates the data bit stream format produced by the data processor according to the invention.

FIG. 3 illustrates the data bit stream format in accordance with the present invention. Here, as with the prior art data bit stream of FIG. 2, the first signal in a frame of the data bit stream is a SYNC signal 60. This SYNC signal is a unique multibit signal used in data retrieval to locate the beginning of a frame of data. The SYNC signal 60 is particularly crucial for use in the solid state flight data recorder wherein once a memory unit is filled, new data is rewritten over the oldest stored data.

Following the SYNC signal 60 is a reference clock signal 62. As with the time signal 52 of FIG. 2, the reference clock signal 62 is a multibit signal indicating total elapsed time from a defined initial time point, such as aircraft take-off.

The formatting of data in the data processing system according to the present invention is totally different from the format used in the prior art of FIG. 2. First, rather than recording a value for each parameter being monitored during each frame, as shown in FIG. 2, the present data processing system records only those parameters whose values have changed beyond a tolerance amount from the previous value. In this way, redundant data is deleted. Further, a multilevel (tiering) time format is used.

Following the reference clock signal 62 are a series of data triplets, such as triplets 64, 66. Each triplet is comprised of a label, a time tag and the corresponding datum. A triplet is not recorded for a parameter unless that parameter has changed beyond a tolerance amount for that parameter from its previous recorded value. By eliminating "redundant" data points, the system can dramatically reduce the amount of data which must be stored.

The label within a triplet is a multibit signal indicating the parameter being recorded. In one embodiment of the invention, the label signal has a length of six bits, whereby 64 different aircraft parameters (minus reserved bit patterns for SYNC and other unique signals) may be monitored.

Following the label signal is a multibit time tag signal. The time tag signal represents a time interval from the previous reference clock signal 62 within which the corresponding datum signal was recorded. Thus, for example, in one embodiment of the invention, the time tag signal was selected to be a 2-bit signal. This 2-bit signal is capable of indicating four discrete time intervals. Each time interval was assigned a duration of one-eigth second. In this scheme, a time tag of 00 indicates that the corresponding data within the triplet was recorded within one-eigth second of the time indicated by the reference clock signal 62. A time tag of 01 indicates that the data for the triplet was recorded in an interval from one-eigth to one-quarter of a second subsequent to the time indicated by the reference clock signal 62, and so forth.

Following the time tag is the datum value for that triplet. This datum value may be the actual value of the parameter, or an incremental value referenced to the previous stored value for the parameter. Thus, all triplets corresponding to data recorded within one-half second (four discrete one-eigth second intervals) from the reference clock signal 62 are formatted into the data bit stream subsequent to the reference clock signal 62.

At predetermined time intervals from the reference clock signal 62, special time tick signals, such as signals 68 and 70 are produced. In one embodiment of the invention, the special time tick signals 68 and 70 are produced at one-half second intervals subsequent to the reference clock signal 62. Following each special time tick signal 68 and 70 are those data triplets having time tags referenced to the preceding special time tick signals 68 and 70. For example, the triplet 72 which immediately follows the first special time tick signal 68 contains, as before, a parameter label followed by a 2-bit time tag signal wherein the four discrete levels represented by the 2-bit time tag signal indicated in one-eighth second intervals time referenced to the special time tick signal 68 in which the corresponding data point was recorded. Similarly, the first triplet 74 following special time tick signal 70 includes a 2-bit time tag signal which indicates that one of four one-eighth second intervals subsequent to the special time tick signal 70 in which the corresponding data in the triplet 74 was recorded.

At the conclusion of a frame of data is a checksum label 80, indicating that a checksum value immediately follows, and the corresponding checksum signal 82.

Thereafter, a new SYNC signal 84 is produced followed by a new, updated reference clock signal 86 and so forth.

By providing a multilevel time format for the recorded data (i.e., a reference clock signal having special time tick signals related thereto, with time tag signals being related to a preceding reference clock signal or a special time tick signal) the data processor according to the present invention realizes a substantial reduction in the amount of data which must be recorded. For example, in a flight data recorder having the following constraints:

Basic time resolution—one-eighth second
Maximum clock time span—one hour (3600 seconds)
Number of parameters—50
Data size per parameter—8 bits
Memory quantum—8 bits per byte
Average aggregate sample recording rate—10 samples/second, a data format scheme known to the prior art (FIG. 2) requires in excess of 3,000 bits of memory for each second of recording time. In a system which eliminates recording redundant data points, but which does not employ a multilevel time format, 320 bits of memory per second of record time is required. A format scheme which both eliminates recording redundant data and which employs the aforedescribed multilevel time format requires only 176 bits of memory for each second of record time. As such, a system employing both redundancy deletion and a multilevel time format allows approximately 80% more data to fit into a given memory than with a system employing redundancy deletion alone.

Figure 4:
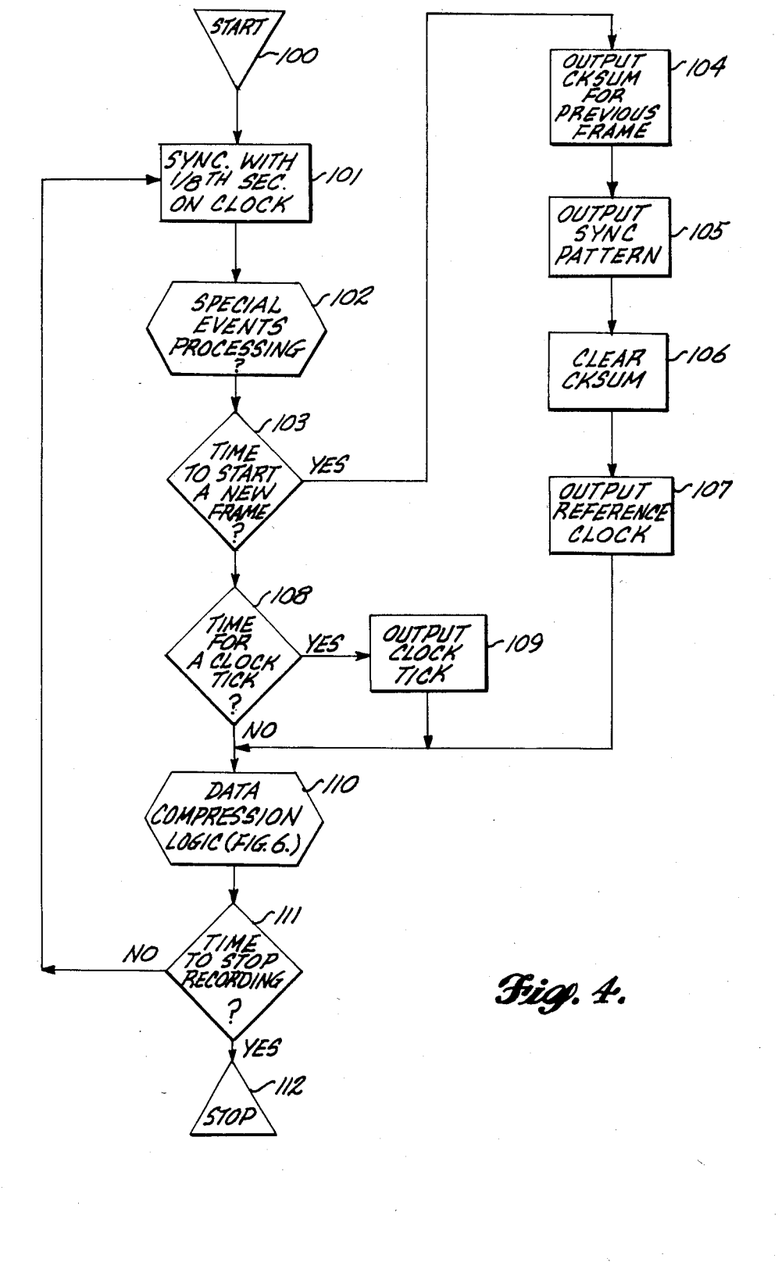
FIG. 4 is a logic flow diagram illustrating the sequential steps executed by the data processor in the data recording mode of operation.

FIG. 4 is a logic flow diagram illustrating the sequential steps executed by the CPU (24 of FIG. 1) in accordance with programming (stored in ROM 26) during the recording mode of the data processor.

Beginning at block 100, the CPU first synchronizes its processing with the one-eighth second intervals on the reference clock at block 101. The CPU then performs the processing for special (or baseline) events at block 102.

Figure 5:
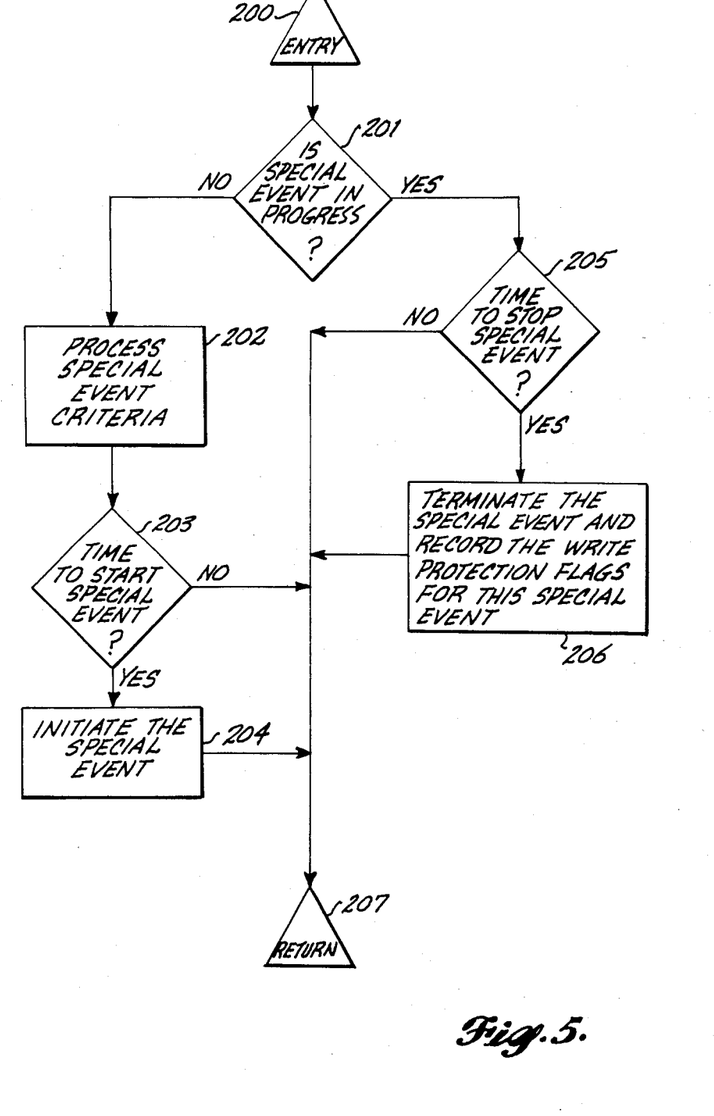
FIG. 5 is a logic flow diagram illustrating the sequential steps executed by the data processor to accomplish special event or baseline data processing.

FIG. 5 is a logic flow diagram illustrating the sequential steps executed by the processor to perform special (or baseline) event processing. As an overview, it may be desirable to program the flight data recorder such that if one or more input data parameters indicate an unusual occurrence, the special event mode is entered. In many instances, it is desirable simply to collect data for use as a baseline for purposes of comparison with other data. The special event processing may be suitable for collecting such baseline information. Typically, if a special or baseline event is to be recorded, a predetermined time interval (for example 30 seconds) of data in memory centered about the special or baseline event (i.e., 15 seconds worth of data on either side of the special or baseline event) is identified. The memory locations of the identified data points are stored by the CPU, and these data points are protected from overwrite which occurs when the memory is filled and the CPU begins writing new data over the oldest data stored in memory.

The special or baseline event processing is entered at block 200 of FIG. 5 (from block 102 of FIG. 4). The CPU first determines, at block 201, whether or not a special event is presently in progress. If a special event is not in progress, the system increments to block 202, and the CPU processes the various criteria that can cause the recording of special or baseline events. A typical example of an event triggering special event processing is an engine failure during flight. At block 203, the CPU determines whether or not any of the special event criteria has been met and, if so, initiates the special event processing at block 204. The initiation of special event processing typically consists of three items:

(1) Recording the memory address at which the write protection is to begin,
(2) Recording an indication of which criteria caused the special event, and
(3) Requesting the data compression logic (described hereinbelow with respect to FIGS. 4 and 6) to record a "snapshot" of the data. A snapshot is a record of each input parameter at a given point in time.

Following the initiation of special event processing in block 204, or in the event that at decision block 203 it was determined that it is now time to initiate a special event, the system increments to return block 207, thereby returning to sequential steps following the special events processing block 102 of FIG. 4.

If the CPU decides at block 201 that a special event is in progress it determines, at block 205, whether or not it is time to stop this special event processing. As mentioned hereinabove, special event processing continues for a finite time period after the special, or baseline event was triggered. If it is not time to stop special event processing, the system increments to return block 207.

If, however, at block 205 it is determined that special event processing is to terminate, block 206 is entered. Here, the write protection flags for the special event data are recorded (to prevent overwrite) and the system increments to return block 207.

Returning to FIG. 4, following special events processing in block 102, a test is made at block 103 to determine whether or not it is time to start a new frame of data. A new frame of data is started in the event either all triplets following the final produced special time tick output or a predetermined elapsed time has occurred since the start of the previous frame.

If a new frame is to be started, the checksum of the data for the previous frame, along with a checksum label, is output at block 104. Thereafter, the new frame is instituted at block 105 by outputting a SYNC pattern signal. The CPU then clears the checksum for the new frame at block 106 and then outputs the updated reference clock value at block 107. The system then proceeds to the data compression logic in block 110, as is described in detail hereinbelow.

If, however, it is not time to institute a new frame at block 103, the system proceeds to decision block 108. At decision block 108, the CPU determines whether or not it is time to mark a special time tick. As is discussed with reference to FIG. 3, special time ticks are output at regular (e.g., one-half second) intervals following a reference clock signal. If it is time to output a special time tick signal, the CPU, at block 109, causes the appropriate special time tick signal to be produced. Following the special time tick signal at block 109, or in the event that at decision block 108 it is not time to mark a special time tick signal, the system increments to the data compression logic at block 110.

Figure 6:
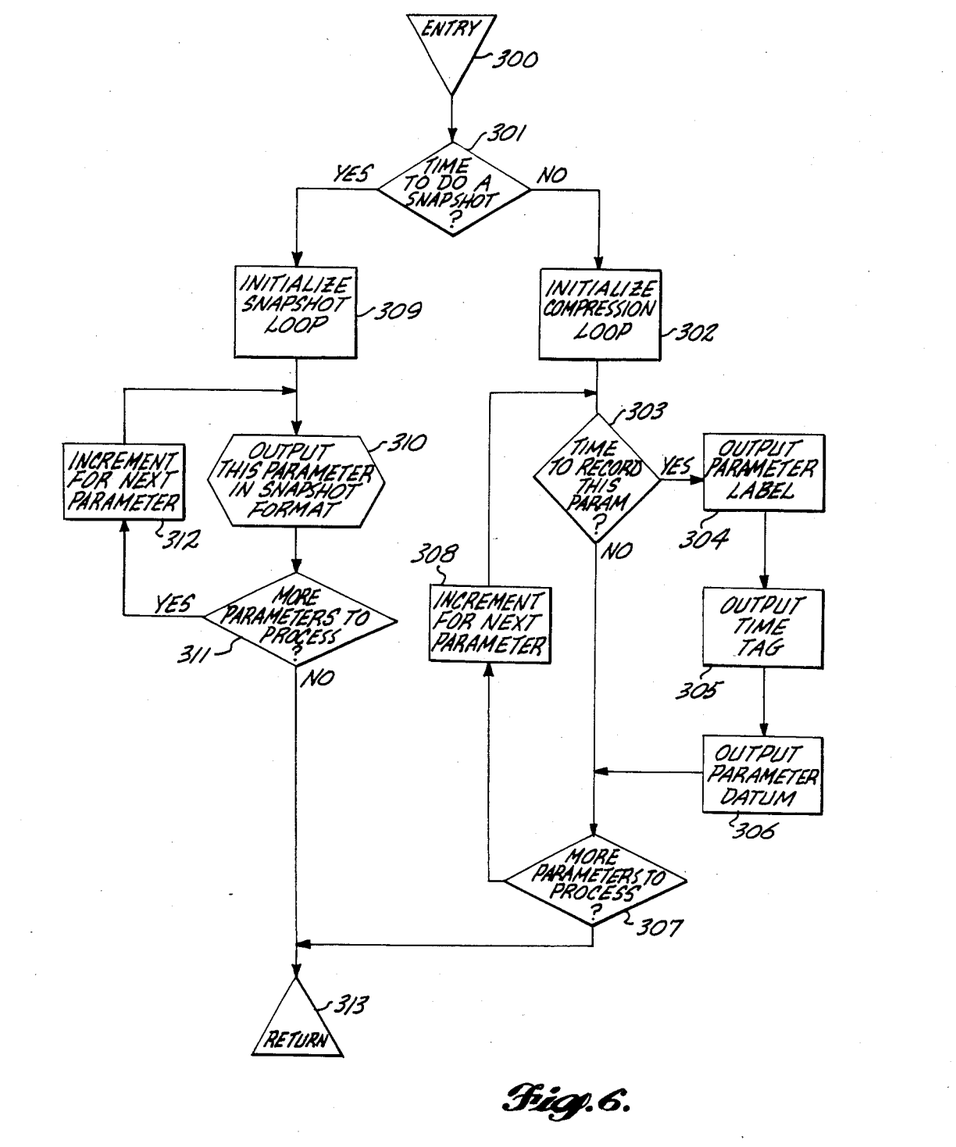
FIG. 6 is a logic flow diagram illustrating the sequential steps executed by the data processor to accomplish data compression.

FIG. 6 is a detailed logic flow diagram illustrating the sequential logic steps performed by the system at block 110 of FIG. 4 for accomplishing data compression. Following the entry block 300, the CPU determines, at block 301, whether to perform normal data compression or to output a snapshot (i.e., record the current values of all parameters). The system produces a snapshot as a result of initiation of a special event (FIG. 5, block 204) or if a specific amount of time has elapsed since the previous snapshot (e.g., two minutes).

If, at block 301, the CPU determines that normal data compression is to be performed, it increments to the initialize compression loop 302. At block 302, the CPU begins normal data compression by initializing the loop that processes each of the individual parameters in turn. The data redundancy deletion is performed in block 303. Each present data value is compared with the value for that parameter previously stored in memory. If the difference between these two values is within a stored tolerance, or window, for this parameter, then the system does not record the current parameter value. In other words, the test at block 303 determines whether or not the present value of the parameter has changed significantly enough from its former value to warrant recording the new data point. If the new data point is sifnificantly different from its stored value, the system constructs a data triplet for this parameter. The triplet is comprised of an output label, at block 304, an output time tag, at block 305, and the output data value, at block 306.

Following the production of the triplet at block 306, or if the data point is not to be recorded, the CPU decides, at block 307, whether there are additional parameters to process. If there are, the CPU indexes to the next input parameter (i.e., the next data signal provided from the data acquisition system 18 as dictated by the data access sequence in ROM 26) at block 308. The process of deciding whether this new parameter data signal should be recorded and, if so, the production of the corresponding triplet signal is repeated.

If, however, the decision at block 307 indicates that all possible parameters have been processed, the CPU increments to return block 313, thereby returning to block 110 of FIG. 4.

If it is determined, at block 301, that it is time to do a snapshot, the system increments to block 309 and initializes the loop which processes the parameters in the snapshot mode. Thus, at block 310, the CPU outputs the snapshot parameters. The parameters may be output in data triplets, as described with respect to blocks 304–306, or, alternatively, the parameters may be output in a fixed frame format as depicted in FIG. 2. The CPU, in decision block 311, determines if there are more parameters to process. If there are, the system advances to the next parameter in block 312 and then repeats to block 310. When all of the parameters have been processed, the CPU increments to the return block 313, returning to block 110 of FIG. 4.

Returning to FIG. 4, following the data compression logic block 110, the system increments to a decision block 111. At decision block 111, the CPU decides if it is time to stop the recording process. The completion of the recording process may be indicated, for example, by a safe landing of the aircraft. In the event that it is time to stop recording, the CPU stops its recording process as indicated at block 112. If, however, the recording process is to continue, the CPU increments back to synchronize with the master clock signal at block 101, thereby repeating the entire aforedescribed process.

Figure 7:
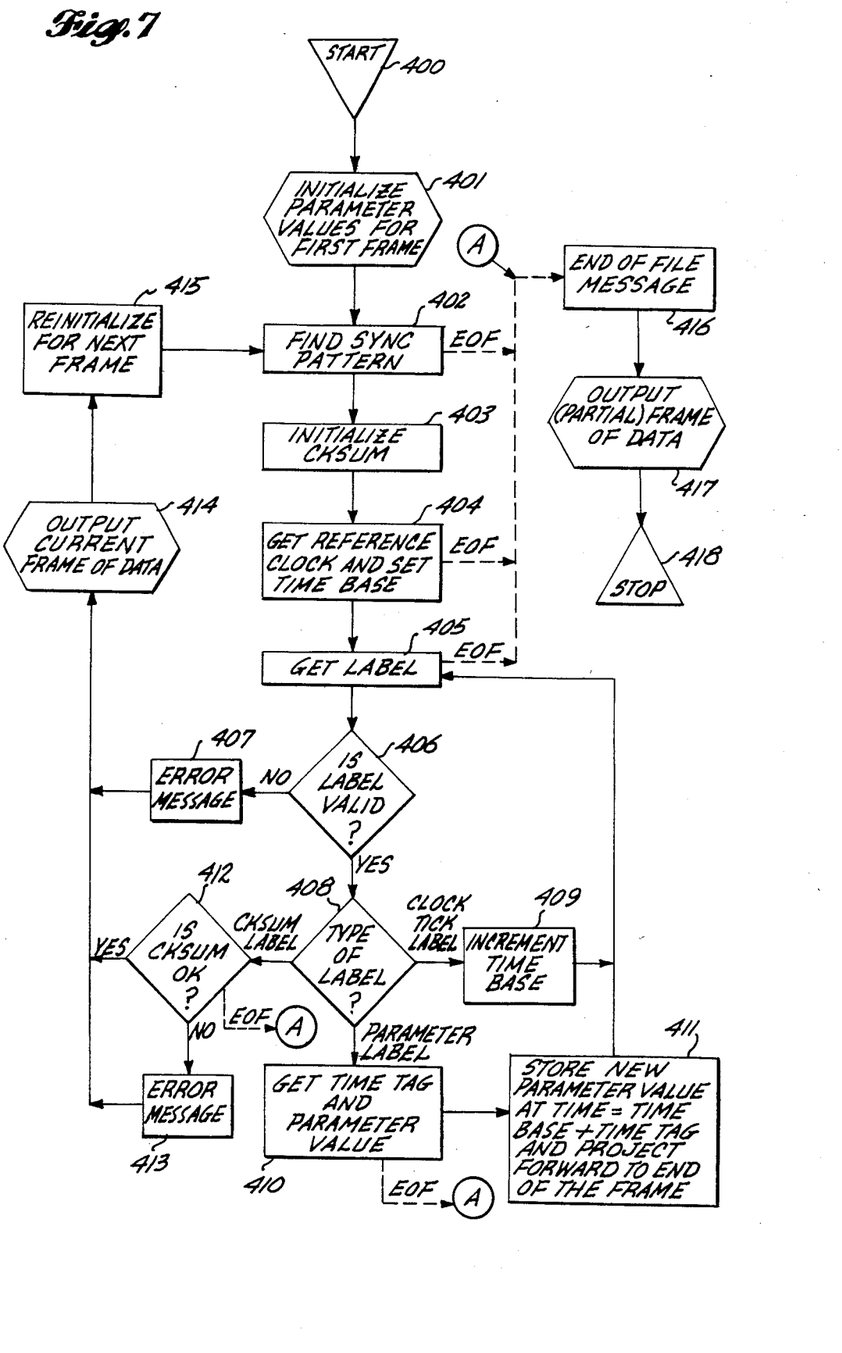
FIG. 7 is a logic flow diagram illustrating the procedure for the decompression of stored data.

FIG. 7 is a logic flow diagram illustrating the basic logic for decompressing the data stored in memory (for example, memory 34, 36 of FIG. 1) in accordance with the aforedescribed compression scheme.

The decompression process starts at block 400, with the parameter values being initialized in block 401. Whereas there are several alternative methods for decompressing, the preferred method is to preprocess the input file from the memory until at least one recorded value is found for each and every parameter. The first recorded value for each parameter is then used as the initial value of that parameter. An alternative method is to assign a specific nominal value as the initial value of each parameter. This initial value is then used to fill in the time gap between the beginning of the frame and the time at which the parameter was first recorded subsequent to the beginning of the first frame. It should be recalled that the recording process overwrites the oldest data when the memory is full. Once the parameters have been initialized, the system increments to the block 402.

In block 402, the system scans the input data looking for a SYNC pattern. Once a SYNC pattern is found, the system clears the checksum in block 403, and reads the reference clock signal, thereby setting the time base in block 404.

The system then reads a label in block 405. The label is tested for validity in block 406. If the label is not valid, the system generates an error message in block 407 and increments to block 414. If the label is valid, the system increments to block 408, where it determines the type of the label. If it is a clock tick label, the system updates the time base in block 409 and then proceeds to block 405 to get the next label. If, at block 408, the block is identified as a parameter label, the system increments to block 410 where it picks up the time tag and parameter data value.

Block 411 contains the logic to generate the appropriate time (i.e., time base plus time tag), update the parameter value at that time, and project the updated parameter value forward to the end of the frame. Having updated the parameter data, the system proceeds to block 405 to get the next label.

If the label, at block 408, is a checksum label, the system increments to block 412. Here, it compares the checksum read from the input file against the checksum computed from the input data. If the checksums agree, the system proceeds to block 414. If, however, the checksums disagree, the system generates an error message at block 413, before proceeding to block 414. At block 414, the system outputs the current frame of data. Block 414 will typically include computations that convert the data to engineering units, as well as directing the processed output data to appropriate output devices, such as printers, plotters and the like.

The system then increments to block 415, where it reinitializes the parameter values for the next frame by projecting the final parameter values of the last output frame forward to the end of the new frame. The system then increments to block 402 where it searches for the SYNC pattern which begins a subsequent frame.

This process repeats until the input file is exhausted (End of File). The "End of File" may be encountered whenever the input file is being read, i.e., blocks 402, 404, 405, 410 and 412. Whenever an End of File is encountered, the system proceeds to block 416, where it generates an End of File message before proceeding to block 417. At block 417 it outputs the final (partial) frame of data in the same manner as it did in block 414. Following block 417, the system increments to the stop block 418 thereby terminating the decompression process.

FIG. 7, therefore, details the sequential logical steps performed during retrieval and decompression of stored, compressed data. Data which has been stored in accordance with the special or baseline event mode, as described with respect to FIG. 5, may be retrieved from memory using known techniques. With respect to recorded snapshots, if the snapshot data has been recorded in triplets, the decompression scheme of FIG. 7 may be used. If, however, the snapshot data has been recorded in accordance with the format of FIG. 2, known data retrieval techniques may be employed.

In summary, a data processing system for use in a solid state flight data recorder, has been described in detail. The system receives a plurality of input system parameter signals and, by redundancy deletion and the use of a multilevel time format, substantially compresses the data before it is loaded into memory. In addition, the processor is capable of selecting that data to be recorded in either a normal or a snapshot mode and, further, is capable of preventing selected data from being overwritten in a special event (or baseline) mode.

The stored, compressed data is reliably recovered by appropriate decompression apparatus.

While a preferred embodiment of the invention has been described in detail, it should be apparent that many modifications and variations thereto are possible, all of which fall within the true spirit and scope of the invention.

The embodiments of the invention in which an exclusive property or privilege is claimed are defined as follows:

1. In an aircraft flight data recorder system of the type wherein a plurality of input data signals that represent the status of corresponding aircraft parameters are periodically processed to provide a series of data frames with each data frame representing the status of selected ones of said aircraft parameters at particular points in time and with each data frame providing aircraft parameter status and associated time information that is stored in a memory device of the flight data recorder system for later retrieval therefrom, the improvement comprising:
   (a) means for periodically producing within each data frame at least one reference time signal representative of elapsed time from a predetermined initial point in time;
   (b) means for sequentially determining, in accordance with a predetermined program, whether a signal representative of an input datum signal of said plurality of input data signals is to be included in a data frame, said means for sequentially determining including:
      (i) means for producing for each input datum signal to be represented in said data frames a label signal representative of the aircraft parameter corresponding to the input datum signal,
      (ii) means for producing for each said datum signal to be represented in said data frame, a time tag signal that is referenced to said reference time signal and is representative of a time interval within which the datum signal was produced, and
      (iii) means for producing for each said input datum signal to be represented in said data frame, a datum value signal representative of the input datum signal.

2. An aircraft flight data recorder system in accordance with claim 1 wherein said improvement further comprises:
   means for producing in said data frame a time tick signal indicative of a predetermined elapsed time from the preceding produced reference time signal, each said time tag signal produced subsequent to a time tick signal being indicative of a time interval from the preceding time tick signal.

3. The improvement of claim 2, wherein said means for sequentially determining whether a signal representative of an input datum signal is to be included in a data frame includes:
   means for recalling for an input datum signal the datum value signal for that same input datum signal at the time at which said same datum signal last was included in a data frame;
   means for comparing the recalled datum value signal with the current value of said same input datum signal; and
   means for including said signal representative of said input datum signal in said data frame only when the difference between said recalled datum value and said current value of said same datum signal is outside a predetermined tolerance range for the aircraft parameter corresponding to said datum signal.

4. An aircraft flight data recorder system in accordance with claim 1, wherein said improvement further comprises means responsive to a special event condition for identifying predetermined data value signals stored in said memory device both prior, and subsequent to said special event condition to prevent said identified data value signals from being overwritten with data value signals included in subsequent data frames of said series of data frames.

5. The improvement of claim 4, wherein said means responsive to a special event condition stores a datum value signal at a predetermined point in time for each said aircraft parameter.

6. The improvement of claim 1, wherein said means for sequentially determining whether a signal representative of an input datum signal is to be included in a data frame includes:
   means for recalling for an input datum signal the datum value signal for that same input datum signal at the time at which said same datum signal last was included in a data frame;
   means for comparing the recalled datum value signal with the current value of said same input datum signal; and
   means for including said signal representative of an input datum signal in said data frame only when the difference between said recalled datum value and said current value of said same datum signal is outside a predetermined tolerance range for the aircraft parameter corresponding to said datum signal.

7. An aircraft flight data recorder system in accordance with claim 1, wherein said improvement further comprises means responsive to a snapshot event condition to store in said memory device a datum value signal at a predetermined point in time for each said aircraft parameter.

8. An aircraft flight data recorder system in accordance with claim 3, wherein said improvement further comprises means responsive to a snapshot event condition to store in said memory device a datum value signal at a predetermined point in time for each said aircraft parameter.

9. In a flight data recorder that is connectable for receiving a plurality of data signals that are supplied by one or more systems of an aircraft with each datum signal of said plurality of data signals representing the status of an aircraft parameter at a point in time, apparatus comprising:

memory means for predeterminedly storing signals loaded therein, and data processing means including:
(a) means for periodically producing a reference time signal representative of elapsed time from a predetermined initial time period,
(b) means for sequentially determining, in accordance with a predetermined program, whether each datum signal is to be stored in said memory means and, in response to determining that a datum signal is to be stored, producing a triplet signal, said triplet signal comprising:
  (i) a label signal representative of the aircraft parameter corresponding to said datum signal,
  (ii) a time tag signal representative of a time interval from said reference time within which said datum signal was produced, and
  (iii) a datum signal value representative of said datum signal, and
(c) means for predeterminedly combining said data processing means produced signals into a data bit stream suitable for loading into said memory means.

10. The apparatus of claim 9, wherein said data processing means further includes:

means for including in said data bit stream a time tick signal indicative of a predetermined elapsed time from the preceding produced reference time signal, with each time tag signal produced subsequent to a time tick signal being indicative of a time interval from the preceding time tick signal.

11. The apparatus of claim 10, wherein said data processing means means for combining said data processing means produced signals in a data bit stream having a format in descending sequential order of:
(i) said reference time signal,
(ii) all triplet signals having time tags referenced to said reference time signal,
(iii) said time tick signal, and
(iv) all triplet signals referenced to said time tick signal.

12. The apparatus of claim 11, wherein said data processing means produces multiple time tick signals between successive produced reference time signals and wherein said data bit stream is formed such that each successive time tick signal is followed by all triplets having time tags referenced in time to said each successive time tick signal.

13. The apparatus of claim 12, wherein said data processing means further includes:

means for producing a synchronization signal, and an error identification signal which is a predetermined function of the data in said data bit stream and wherein said data bit stream is formed such that said synchronization signal precedes said reference time signal and said error identification signal follows the last triplet signal after the last time tick signal.

14. The apparatus of claim 13, wherein said data processing means includes means responsive to a special event condition for identifying triplet signals stored in said memory means both prior, and subsequent to said special event condition, to prevent said identified signals from being overwritten with signals included in subsequent portions of said data bit stream.

15. The apparatus of claim 14, wherein said data processing means is responsive to a special event condition to produce a triplet signal for each aircraft parameter at a predetermined point in time.

16. The apparatus of claim 13, wherein said data processing means for determining whether a datum signal for a parameter is to be stored includes means for:

recalling the last datum signal value stored for said parameter, comparing said datum signal value with said recalled datum signal value, and producing a triplet signal for said datum signal in response to the difference between said datum signal value and said recalled datum signal value exceeding a predetermined tolerance range for said parameter.

17. The apparatus of claim 9, wherein said data processing means for determining whether a datum signal for a parameter is to be stored includes means for:

recalling the last datum signal value stored for said parameter, comparing said datum signal value with said recalled datum signal value, and producing a triplet signal for said datum signal in response to the difference between said datum signal value and said recalled datum signal value exceeding a predetermined tolerance range for said parameter.

18. The apparatus of claim 17, wherein said data processing means includes means responsive to a snapshot event condition to produce a triplet signal for each aircraft parameter at a predetermined point in time.

19. The apparatus of claim 9, wherein said data processing means includes means responsive to a special event condition for identifying triplet signals stored in said memory means both prior, and subsequent to said special event condition, to prevent said identified signals from being overwritten with signals included in subsequent portions of said data bit stream.

20. The apparatus of claim 19, wherein said data processing means is reponsive to a special event condition to produce a triplet signal for each aircraft parameter at a predetermined point in time.

21. The apparatus of claim 9, wherein said data processing means includes means responsive to a snapshot event condition to produce a triplet signal for each aircraft parameter at a predetermined point in time.

22. Apparatus for recovering flight data recorder stored data which has been compressed prior to loading into the memory of said flight data recorder, the compression format for each frame of said data including a reference time signal representative of elapsed time from a predetermined initial time period followed by triplet signals, each triplet signal including a label signal representative of the parameter being stored, a time tag signal representative of a time interval from said reference time in which the datum value for said parameter was recorded, and a signal representative of the corresponding datum signal for the parameter being stored, the apparatus comprising:

(a) means for identifying each frame of data stored in said memory, and (b) means for processing the reference time signal and the time tag signal associated with each triplet signal in each frame of data and producing, for each triplet signal, a data output information signal representative of the parameter, its value and the time at which its value was recorded.

23. The apparatus of claim 22, wherein said compression format further includes time tick signals produced at predetermined time intervals from said reference time signal and wherein each time tag signal produced subsequent to a time tick signal is indicative of a time interval from the preceding time tick signal within which a signal representative of the corresponding datum was recorded, and wherein said apparatus further comprises:

means for processing each time tick signal and each triplet signal having a time tag signal referenced thereto and for processing for each triplet signal, said data output signal.

24. The apparatus of claim 23, wherein said compression format further includes preceding each frame of data with a synchronization signal, and wherein said apparatus further comprises:

means for processing said synchronization signals to identify each frame of data.

25. The apparatus of claim 24, wherein said compression format further includes an error identification signal which is a predetermined function of the data in each data frame, and wherein the said apparatus further comprises:

means for processing the data in each data frame in accordance with said predetermined function to produce a check value, means for comparing said error identification signal for each data frame stored in memory with said produced check value, and means for indicating a fault condition for said frame of data responsive to a difference therebetween.

26. The apparatus of claim 22, wherein said compression format further includes means for producing a triplet for a parameter only if said signal representative of said corresponding datum signal has changed by a predetermined tolerance range relative to its previously stored value, and wherein said apparatus further comprises:

means for identifying the earliest value for each parameter stored in memory, means for producing an initial data output signal corresponding to said earliest values, and means for then updating the values for each parameter as subsequent frames of data are processed, thereby producing updated data output information signals.

27. In a method of recording digital signal information representative of a plurality of periodically sampled aircraft operating parameters wherein said digital signal information is presented in a series of repeating data frames, the steps of:

(a) generating within each data frame a reference time signal representative of elapsed time between a predetermined initial point in time and the generation of said reference signal;

(b) sequentially testing said plurality of periodically sampled aircraft operating parameters to determine whether the tested periodically sampled aircraft operating parameter will be represented in said data frame;

(c) producing for each one of said periodically sampled aircraft operating parameters to be represented in said data frame a label signal representative of the aircraft operating parameter;

(d) producing for each said one of said plurality of periodically sampled aircraft operating parameters to be included in said data frame a datum value signal representative of the current value of said periodically sampled aircraft operating parameter that is being represented in said data frame; and, (e) producing for each one of said plurality of said periodically sampled aircraft operating parameters being included in said data frame a time tag signal representative of the number of time intervals of a predetermined length that have elapsed between generation of said time reference signal and production of said datum value signal.

28. The method of claim 27, further comprising the steps of:

producing in said data frame a time tick signal at a predetermined time following the generation of said time reference signals; and, subsequent to generation of said time tick signal producing each said time tag signal to indicate the number of said predetermined time intervals that have elapsed between production of said time tick signal and production of a datum value signal being represented in said data frame.

29. The method of claim 28, wherein said step of sequentially testing said plurality of periodically sampled aircraft operating parameters includes the steps of:

recalling for each aircraft operating parameter being tested the last datum value signal;

comparing said last datum value signal with the value of the aircraft operating parameter being tested to determine whether the value of said aircraft operating parameter being tested has changed by more than a predetermined amount; and, representing said aircraft operating parameter being tested in said data frame only when said aircraft operating parameter has changed by more than said predetermined amount.

30. The method of claim 29, further including the step of initiating a new data frame:

upon the expiration of a predetermined period of time; and upon said testing and generation of label signals, datum value signals and time tag signals for all aircraft operating parameters of said plurality of aircraft operating parameters in the event that said testing and generation is completed prior to expiration to said predetermined period of time.

31. The method of claim 30, further comprising the step of generating a synchronization signal prior to generation of said time reference signal of said data frame.

32. The method of claim 31, further comprising the step of producing an error identification signal subsequent to producing the label signal, datum value signal and time tag signal for the last one of said plurality of aircraft operating parameters that is to be represented in said data frame.

33. The method of claim 27, wherein said step of sequentially testing said plurality of periodically sampled aircraft operating parameters includes the steps of:

recalling for each aircraft operating parameter being tested the last datum value signal;

comparing said last datum value signal with the value of the aircraft operating parameter being tested to determine whether the value of said aircraft operating parameter being tested has changed by more than a predetermined amount; and, representing said aircraft operating parameter being tested in said data frame only when said aircraft operating parameter has changed by more than said predetermined amount.

34. The method of claim 33, further including the step of initiating a new data frame:

upon the expiration of a predetermined period of time; and upon said testing and generation of label signals, datum value signals and time tag signals for all aircraft operating parameters of said plurality of aircraft operating parameters in the event that said testing and generation is completed prior to expiration to said predetermined period of time.

35. The method of claim 34, further comprising the step of generating a synchronization signal prior to generation of said time reference signal of said data frame.

36. The method of claim 35, further comprising the step of producing an error identification signal subsequent to producing the label signal, datum signal and time tag signal for the last one of said plurality of aircraft operating parameters that is to be represented in said data frame.

* * * * *

UNITED STATES PATENT AND TRADEMARK OFFICE
CERTIFICATE OF CORRECTION

PATENT NO. : 4,660,145

DATED : April 21, 1987

INVENTOR(S) : Steven D. Hansen

It is certified that error appears in the above-identified patent and that said Letters Patent is hereby corrected as shown below:

Column 1, line 46, "ditital" should be --digital--

Column 6, line 29, "eigth" should be --eighth--

Column 6, line 31, "eigth" should be --eighth--

Column 6, line 34, "eigth" should be --eighth--

Column 6, line 42, "eigth" should be --eighth--

Column 9, line 22, "sifnificantly" should be --significantly--

Column 13, line 41, insert --includes-- after "processing"
(Claim 11, line 2)

Column 13, line 41, delete "means" (second occurrence)
(Claim 11, line 2)

Column 15, line 61, insert --time-- before "signal"
(Claim 27, line 9)

Signed and Sealed this

Tenth Day of November, 1987

Attest:

DONALD J. QUIGG

Attesting Officer

Commissioner of Patents and Trademarks